(12) United States Patent
Lam

(10) Patent No.: US 8,278,150 B2
(45) Date of Patent: Oct. 2, 2012

(54) STACKABLE PACKAGES FOR THREE-DIMENSIONAL PACKAGING OF SEMICONDUCTOR DICE

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 129 days.

(21) Appl. No.: 12/891,386

(22) Filed: Sep. 27, 2010

(65) Prior Publication Data

US 2011/0014747 A1 Jan. 20, 2011

Related U.S. Application Data

(62) Division of application No. 11/467,786, filed on Aug. 28, 2006, now Pat. No. 7,816,769.

(51) Int. Cl.
H01L 21/44 (2006.01)
H01L 21/48 (2006.01)

(52) U.S. Cl. ........ 438/112; 438/123; 438/124; 438/617; 257/E21.506; 257/E21.509

(58) Field of Classification Search .................. 438/112, 438/123, 124, 617; 257/666, E21.506, E21.509
See application file for complete search history.

(56) References Cited

U.S. PATENT DOCUMENTS

| | | | |
|---|---|---|---|
| 5,157,475 A * | 10/1992 | Yamaguchi | 257/784 |
| 5,422,514 A | 6/1995 | Griswold et al. | |
| 5,541,449 A | 7/1996 | Crane et al. | |
| 5,585,675 A | 12/1996 | Knopf | |
| 5,744,827 A | 4/1998 | Jeong et al. | |
| 5,804,874 A | 9/1998 | An et al. | |
| 5,835,988 A | 11/1998 | Ishii | |
| 6,061,251 A | 5/2000 | Hutchison et al. | |
| 6,294,407 B1 | 9/2001 | Jacobs | |
| 6,320,251 B1 | 11/2001 | Glenn | |
| 6,339,255 B1 | 1/2002 | Shin | |
| 6,414,391 B1 | 7/2002 | Corisis et al. | |
| 6,455,356 B1 * | 9/2002 | Glenn et al. | 438/123 |
| 6,500,698 B2 | 12/2002 | Shin | |
| 6,525,406 B1 | 2/2003 | Chung et al. | |
| 6,563,217 B2 | 5/2003 | Corisis et al. | |

(Continued)

FOREIGN PATENT DOCUMENTS

CN 2613047 4/2004

(Continued)

OTHER PUBLICATIONS

Chinese Application Serial No. 200780032009.9, Office Action mailed Mar. 10, 2010, 11 pgs.

(Continued)

*Primary Examiner* — Nitin Parekh
(74) *Attorney, Agent, or Firm* — Fish & Richardson P.C.

(57) ABSTRACT

An apparatus and a method for packaging semiconductor devices. The apparatus includes a substrate strip component of a leadless three-dimensional stackable semiconductor package having mounting contacts on, for example, four peripheral edges. The substrate strip may either be fabricated for mounting a single electrical component (e.g., an integrated circuit die) or a plurality of substrate strips may be laid out in an X-Y matrix pattern which may later be singulated into individual package strip for leadless packages. Three-dimensional stacking is achieved by a bonding area on an uppermost portion of the sidewall. The sidewall of the strip is high enough to enclose an encapsulant covering a later mounted integrated circuit die and associated bonding wires.

20 Claims, 7 Drawing Sheets

U.S. PATENT DOCUMENTS

| | | | |
|---|---|---|---|
| 6,667,544 | B1 | 12/2003 | Glenn |
| 6,674,159 | B1 | 1/2004 | Peterson et al. |
| 6,710,246 | B1 * | 3/2004 | Mostafazadeh et al. ...... 174/528 |
| 6,812,552 | B2 | 11/2004 | Islam et al. |
| 6,838,768 | B2 | 1/2005 | Corisis et al. |
| 6,969,905 | B2 * | 11/2005 | Paulus ..................... 257/666 |
| 7,122,406 | B1 * | 10/2006 | Yilmaz et al. ................ 438/123 |
| 7,385,299 | B2 | 6/2008 | Chow et al. |
| 7,816,769 | B2 | 10/2010 | Lam |
| 7,846,774 | B2 * | 12/2010 | Yee et al. .................... 438/111 |
| 2002/0022300 | A1 | 2/2002 | Shin |
| 2002/0125571 | A1 | 9/2002 | Corisis et al. |
| 2003/0038378 | A1 | 2/2003 | Jacobs |
| 2003/0197271 | A1 | 10/2003 | Corisis et al. |
| 2003/0203539 | A1 * | 10/2003 | Islam et al. .................. 438/111 |
| 2005/0067680 | A1 | 3/2005 | Boon et al. |
| 2005/0110135 | A1 | 5/2005 | Corisis et al. |
| 2006/0027908 | A1 | 2/2006 | Chang et al. |
| 2007/0281392 | A1 * | 12/2007 | Yee et al. .................... 438/111 |
| 2008/0048308 | A1 | 2/2008 | Lam |
| 2010/0140766 | A1 * | 6/2010 | Punzalan et al. ............. 257/676 |
| 2010/0258925 | A1 * | 10/2010 | Jeon et al. .................... 257/676 |

FOREIGN PATENT DOCUMENTS

| | | | |
|---|---|---|---|
| WO | WO 2005/022591 | A2 | 3/2005 |
| WO | WO-2005022591 | A2 | 3/2005 |
| WO | WO 2008/0247694 | | 3/2008 |
| WO | WO-2008027694 | A2 | 3/2008 |
| WO | WO-2008027694 | A3 | 3/2008 |

OTHER PUBLICATIONS

"Component Stacking for Integrated Circuit Electronic Package", U.S. Pat. Application (incl. drawings), Filed: Dec. 20, 2005, Assignee: Atmel Corporation, Inventor: Ken M. Lam.

International Application No. PCT/US2007/075191, Written Opinion Mailed May 27, 2008, 5 pgs.

International Application Serial No. PCT/US2007/075191, International Search Report mailed May 27, 2008, 4 pgs.

"U.S. Appl. No. 11/467,786, Advisory Action mailed Apr. 14, 2009", 3 pgs.

"U.S. Appl. No. 11/467,786, Final Office Action mailed Jan. 22, 2009", 8 pgs.

"U.S. Appl. No. 11/467,786, Final Office Action mailed Oct. 7, 2009", 9 pgs.

"U.S. Appl. No. 11/467,786, Non-Final Office Action mailed May 21, 2008", 24 pgs.

"U.S. Appl. No. 11/467,786, Notice of Allowance mailed Jul. 21, 2010", 6 Pgs.

"U.S. Appl. No. 11/467,786, Notice of Allowance mailed Mar. 4, 2010", 7 pgs.

"U.S. Appl. No. 11/467,786, Response filed Jan. 7, 2010 to Non Final Office Action mailed Oct. 7, 2009", 6 pgs.

"U.S. Appl. No. 11/467,786, Response filed Mar. 23, 2009 to Final Office Action mailed Jan. 22, 2009", 11 pgs.

"U.S. Appl. No. 11/467,786, Response filed Apr. 23, 2008 to Restriction Requirement mailed Mar. 31, 2008", 8 pgs.

"U.S. Appl. No. 11/467,786, Response filed Jul. 9, 2009 to Restriction Requirement mailed Jun. 11, 2009", 9 pgs.

"U.S. Appl. No. 11/467,786, Response filed Sep. 22, 2008 to Non-Final Office Action mailed May 21, 2008", 11 pgs.

"U.S. Appl. No. 11/467,786, Restriction Requirement mailed Mar. 31, 2008", 6 pgs.

"U.S. Appl. No. 11/467,786, Restriction Requirement mailed Jun. 11, 2009", 5 pgs.

"U.S. Appl. No. 11/467,786, Restriction Requirement mailed Jun. 22, 2010", 5 pgs.

Chinese Application Serial No. 200780032009.9, Response to Office Action mailed Mar. 10, 2010, 5 pgs.

Office Action for CN200780032009.9 dated Sep. 21, 2011 with English translation; 9 pages.

* cited by examiner

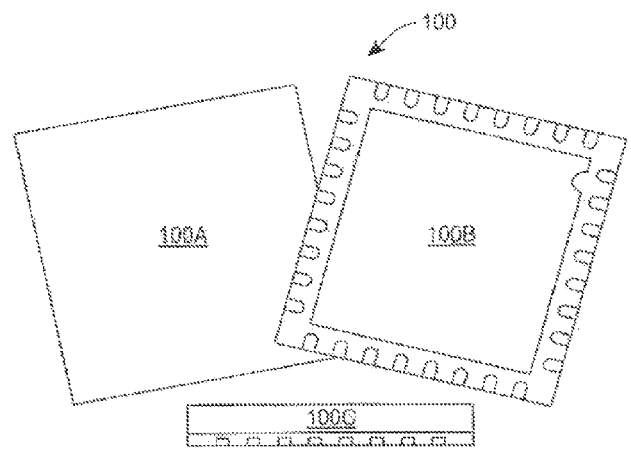
Fig. _1A
(Prior Art)
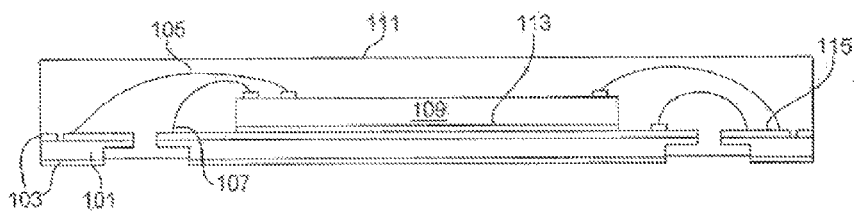
Fig. _1B
(Prior Art)
Fig. _2A
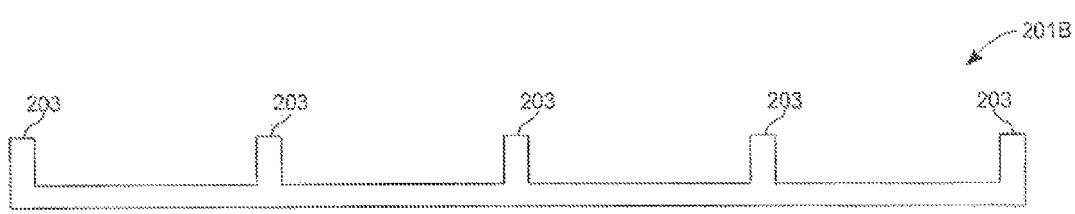
Fig. _2B

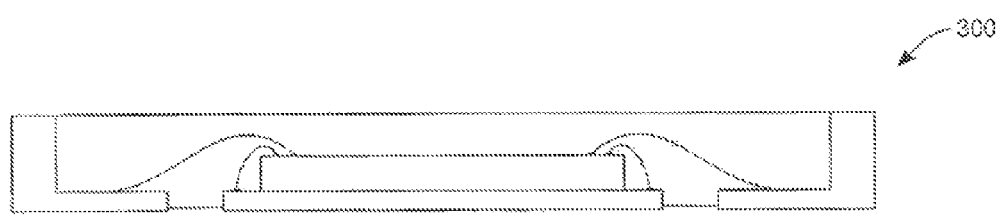
Fig._3A
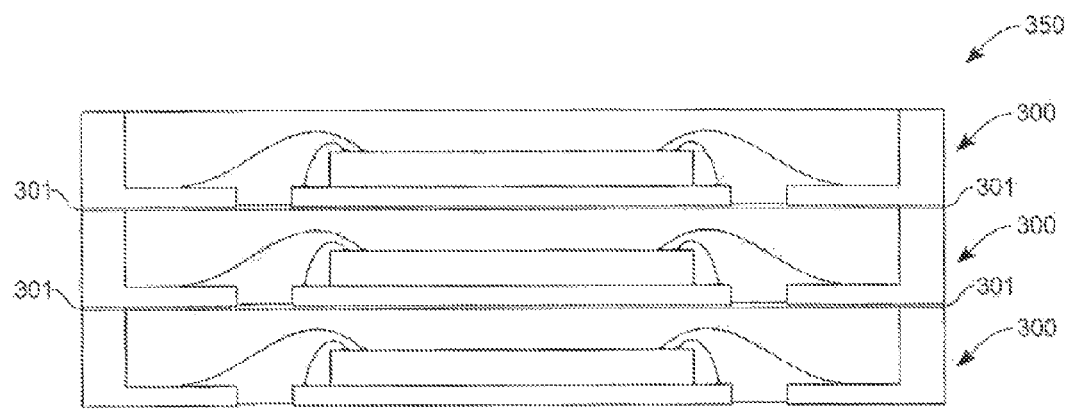
Fig._3B

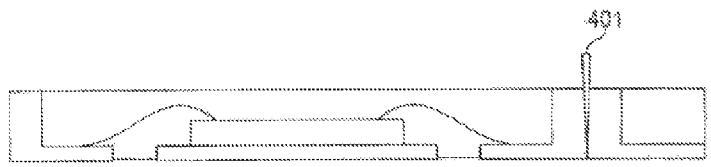
Fig. _ 4A
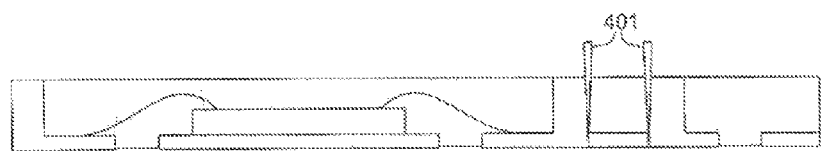
Fig. _ 4B
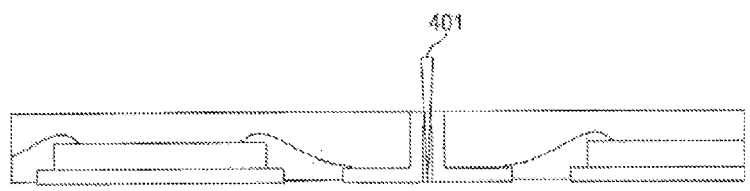
Fig. _ 4C
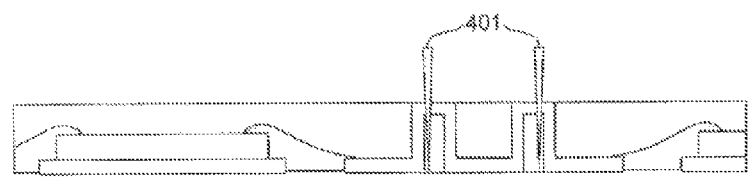
Fig. _ 4D

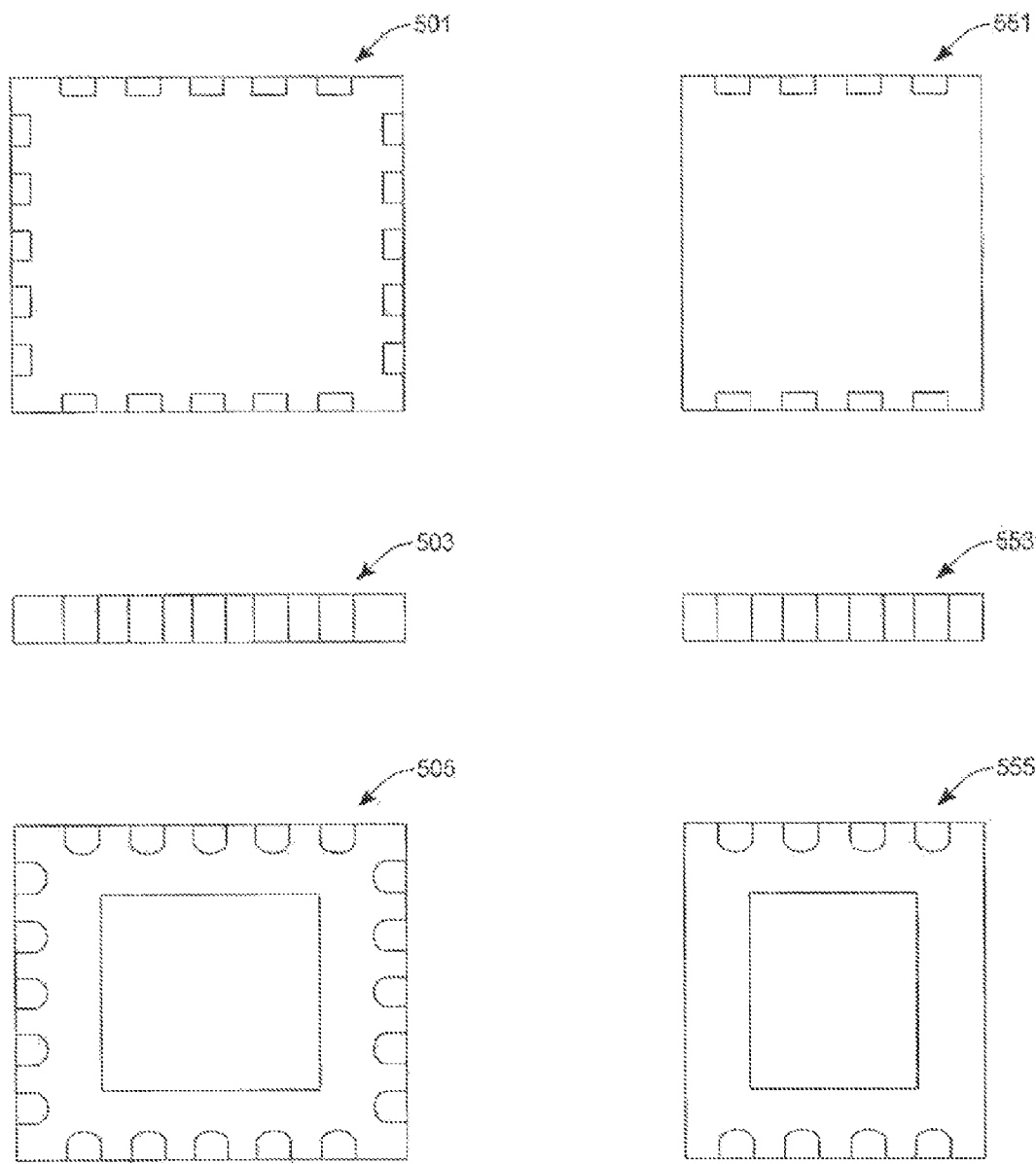
Fig._5

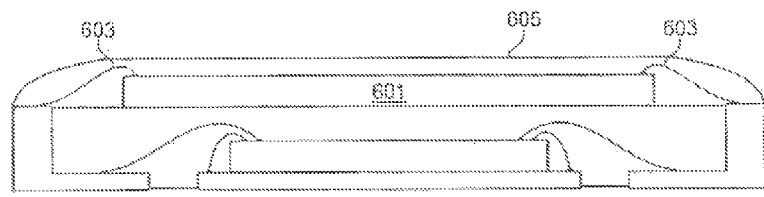
Fig. _6A
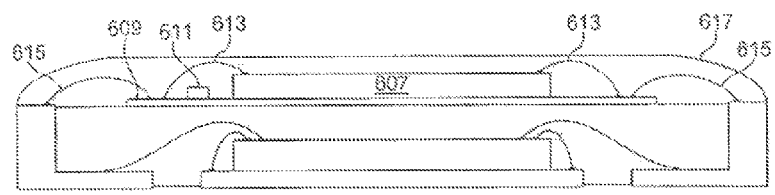
Fig. _6B

STACKABLE PACKAGES FOR THREE-DIMENSIONAL PACKAGING OF SEMICONDUCTOR DICE

CLAIM OF PRIORITY

This application is a divisional of and claims the benefit of priority under 35 U.S.C. §120 to U.S. patent application Ser. No. 11/467,786, entitled "STACKABLE PACKAGES FOR THREE-DIMENSIONAL PACKAGING OF SEMICONDUCTOR DICE," filed on Aug. 28, 2006, which is hereby incorporated by reference herein in its entirety.

TECHNICAL FIELD

The invention relates to a three-dimensional stackable semiconductor package, and more particularly, to a three-dimensional stackable semiconductor package for package types involving no-lead packages.

BACKGROUND ART

As semiconductor integrated circuit chips become more mufti-functional and highly integrated, the chips include more bonding pads (or terminal pads), and thus packages for the chips have more external terminals (or leads). When a conventional plastic package having leads along the perimeter of the package must accommodate a large number of electrical connection points, the footprint of the package increases. However, a goal in many electronic systems is to minimize an overall size of the systems. Thus, to accommodate a large number of pins without increasing the footprint of package, pin pitch (or lead pitch) of the package must decrease. However, a pin pitch of less than about 0.4 mm gives rise to many technical concerns. For example, trimming of a package having a pin pitch less than 0.4 mm requires expensive trimming tools, and the leads are prone to bending during handling of the package. In addition, surface-mounting of such packages demands a costly and complicated surface-mounting process due to a required critical alignment step.

Thus, to avoid technical problems associated with conventional fine-pitch packages, packages that have area array or leadless external terminals have been suggested. Among these packages are ball grid array packages, chip scale packages, Quad Flat-Pack No-Lead (QFN) packages, and Dual Flat-Pack No-Lead (DFN) packages. The semiconductor industry presently uses a number of chip scale packages. A micro ball grid array package (µBGA) and a bump chip carrier (BCC) are examples of the chip scale packages. The µBGA package includes a polyimide tape on which a conductive pattern is formed and employs a totally different manufacturing process from a conventional plastic packaging. The bump chip carrier package includes a substrate having grooves formed around a central portion of a top surface of a copper alloy plate and an electroplating layer formed in the grooves. Accordingly, chip scale packages use specialized packaging materials and processes that increase package manufacturing costs.

FIG. 1A is a typical plastic encapsulated package 100 of the prior art (showing top 100A, bottom 100B, and side views 100C of the package). Specifically, the encapsulated package 100 is a QFN package. The QFN package 100 is a leadless package where electrical contact to a printed circuit board (PCB) is made by soldering lands on the bottom 100B surface of the packages 100 to the PCB, instead of more traditional formed perimeter leads being soldered to the PCB.

FIG. 1B is a cross-sectional view of the prior art QFN package 100 in use and includes a copper land 101, a plurality of solder plating areas 103, a plurality of gold lead wires 105, and a down bond area 107. The copper land 101 frequently has a plating material 115 applied, such as silver, to facilitate gold or aluminum wire bonding (not shown). An integrated circuit die 109 is attached to the QFN package 100 with a suitable die attach material 113, such as a thermal epoxy. A mold compound 111 or other covering material is applied to finalize the QFN package 100.

Therefore, an integrated circuit package such as a QFN or DFN that uses conventional packaging materials and processes can only be accessed for electrical interconnection, for example, to a printed circuit board, by lower portions of the copper leadframe 101/plating area 103 (FIG. 1B) which are found only on the bottom surface of the package. Consequently, what is needed to provide for a higher density of integrated circuit packaging into a given printed circuit board footprint is a means of allowing the integrated circuit packages to be readily stacked, one atop another, or even side-by-side.

SUMMARY

In one exemplary embodiment, the present invention is a substrate strip component of a leadless three-dimensional stackable semiconductor package having mounting contacts on, for example, top, bottom, and sides of four peripheral edges. The substrate strip may either be fabricated for mounting a single electrical component (e.g., an integrated circuit die) or a plurality of substrate strips may be laid out in an X-Y matrix pattern. The matrix of strips may later be singulated into individual package strips for leadless packages.

Each of the substrate strips includes a leadless outer portion having a plurality of sections electrically isolated from each other. Each of the sections has a flat wire bonding area and a sidewall area that is essentially perpendicular to the flat wire bonding area. The sidewall area is concentrically located on an outermost periphery of the outer portion.

Each substrate strip also includes an inner portion located concentrically within and electrically isolated from the outer portion. The inner portion is thinner than the sidewall area of the outer portion and is designed to serve as an attachment area for an integrated circuit die or other electrical component. A combined thickness of the inner portion and the integrated circuit die (or component) is less than a height of the sidewall area. This mounting arrangement leaves an uppermost portion of the sidewall areas electrically exposed for mounting additional leadless packages or other components on top of the first package.

In another exemplary embodiment, a substrate strip component of a leadless three-dimensional stackable semiconductor package has mounting contacts on, for example, top, bottom and sides of two opposing (e.g., parallel) edges. The substrate strip may either be fabricated for mounting a single electrical component (e.g., an integrated circuit die) or a plurality of substrate strips may be laid out in an X-Y matrix pattern. The matrix of strips may later be singulated into individual package strip for leadless packages.

In this embodiment, the substrate strip has a pair of parallel leadless outer portions. Each leadless outer portion has a plurality of sections electrically isolated form each other. Each section also has a flat wire bonding area and a sidewall area essentially perpendicular to the flat wire bonding area, the sidewall area being located on an outermost edge of each of the outer portions.

An inner portion is located between and electrically isolated from the pair of outer portions. The inner portion is thinner than the sidewall area of the parallel outer portions and is designed to serve as an attachment area for an integrated circuit die or other electrical component. A combined thickness of the inner portion and the integrated circuit die (or component) is less than a height of the sidewall area. This mounting arrangement leaves an uppermost portion of the sidewall areas electrically exposed for mounting additional leadless packages or other components on top of the first package.

In another exemplary embodiment, the present invention is a method of packaging a semiconductor device. The method includes mounting an electrical component to an inner portion die pad where the die pad is a portion of a substrate strip component of a first leadless three-dimensional stackable semiconductor package. A plurality of bond wires is secured from a plurality of bond pads on the electrical component to corresponding ones of a plurality of wirebond pads contained on a leadless outer portion of the substrate strip component. The outer portion has a sidewall that has a height greater than a combine height of the electrical component and the inner portion die pad.

The electrical component, bond wires, and any exposed portions of the die pad are then covered with an encapsulating material to a level at or near the uppermost portion of the sidewalls on the leadless outer portion.

BRIEF DESCRIPTION OF THE DRAWINGS

FIGS. 1A and 1B show a QFN chip carrier package of the prior art.

FIGS. 2A-2F show exemplary cross-sections or plan views of stackable integrated circuit die and discrete component carriers in accord with the present invention.

FIGS. 3A and 3B show singulated packages in single and stacked configurations.

FIGS. 4A-4D show various cross-sectional embodiments allowing for differing arrangements of layouts for simulation.

FIG. 5 shows completed exterior views of specific embodiments of QFN and DFN packages in accord with general embodiments of the present invention.

FIGS. 6A and 6B show singulated packages stacked with separate integrated circuit dice and discrete components.

DETAILED DESCRIPTION

In FIG. 2A, a substrate strip 201A is selected to have a thickness close to a final "height" of a completed package. The height chosen for the substrate strip 201A will be based on particular components placed in the final package but will typically vary from 0.2 mm to 2 mm. Additional details to determine an actual height for a given package will be discussed in greater detail, infra.

Processes described herein refer to exemplary embodiments where many packages are formed in an X-Y matrix, although a single package could readily be formed by the same process as well. The X-Y matrix size for the substrate strip 201A may be chosen to suit a particular vendor's tooling. In a specific exemplary embodiment, the X-Y dimensions of the substrate may be 205 mm×60 mm and the construction material is selected to be copper. In other exemplary embodiments, the substrate 201A may be another type of metallic or non-metallic material. The material may be either electrically conductive or electrically non-conductive. Additionally, non-rectangular matrix shapes are contemplated.

In FIG. 2B, the substrate strip 201A is pattern-etched, leaving an etched substrate strip 201B. During the pattern-etching process, a bottom thickness of the substrate strip 201A is reduced while leaving essentially full height sidewalls 203. Pattern forming and pattern-etching steps are known in the art and will vary depending upon material chosen. Areas between the sidewalls 203 are reduced thickness areas. Portions of these areas will serve as a die pad mounting area in subsequent steps. Thus, the sidewalls 203 are areas substantially perpendicular to the reduced thickness areas. A height of the sidewalls is selected to be sufficient such that any mounted integrated circuit and bonding leads contained within the package will be at or below an uppermost portion of the sidewalls 203. Other portions of the bottom thickness will later serve as bond fingers. In a specific exemplary embodiment, bottom portions of the etched substrate strip 201B are reduced to about 0.12 mm (approximately 5 mils) in height.

Figure 2C:
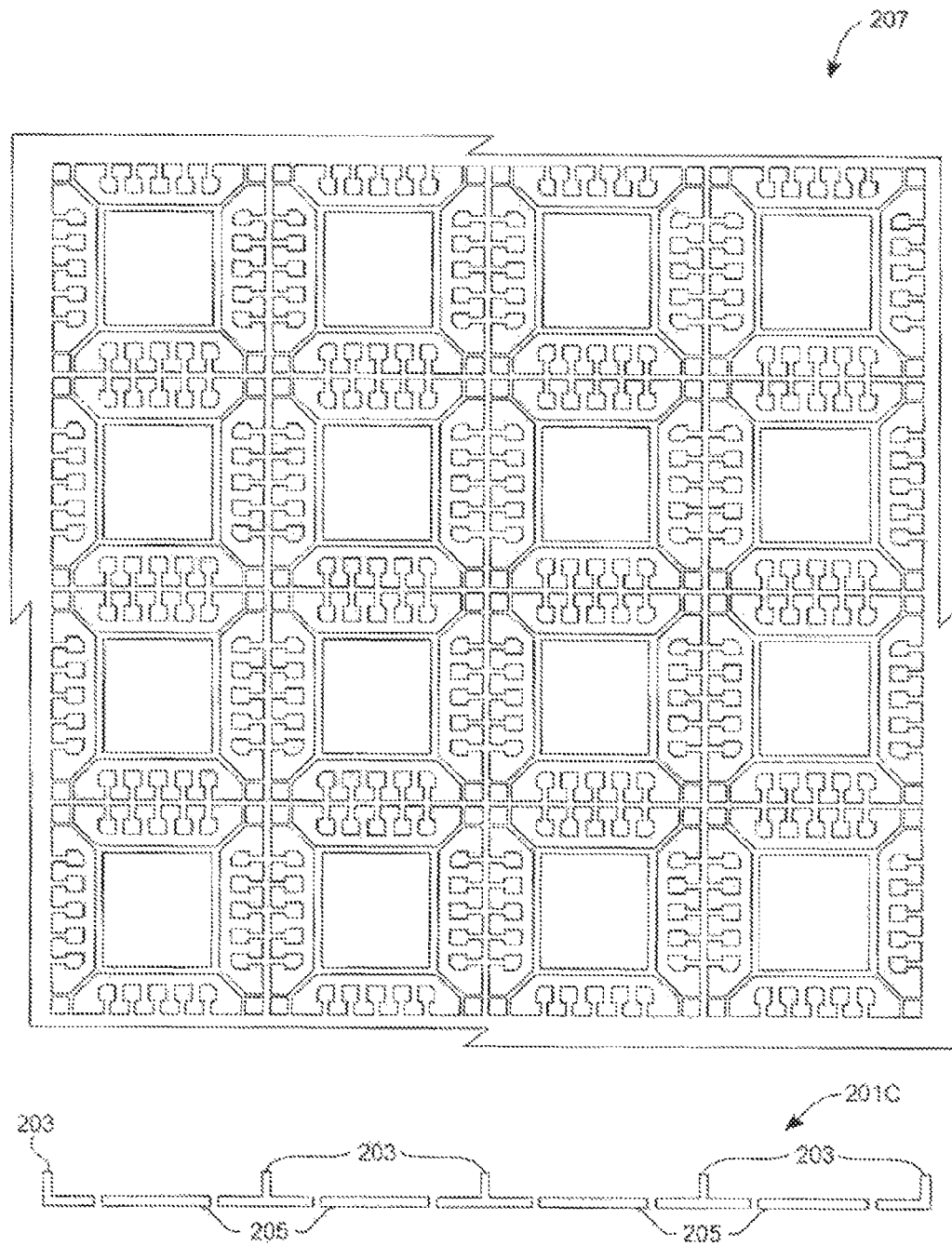

With reference to FIG. 2C, the etched substrate strip 201B is further pattern-etched forming a leadframe substrate strip 201C. The leadframe substrate strip 201C includes die attach pads 205 and the sidewalls 203 are further etched defining separate bond finger features as seen in plan-view 207. The plan-view 207 shows a portion of the exemplary 205 mm×60 mm substrate. As viewed jointly in cross-sectional and plan-view, the bond fingers have integral sidewalls 203 which remain substantially the full height of the leadframe substrate strip 201C. The die attach pads 205 are electrically isolated from the bond finger/integral sidewalls 203 due to the pattern-etch step. In a specific exemplary embodiment, exposed areas of the leadframe substrate strip 201C are either fully-plated or spot-plated with, for example, silver. In other exemplary embodiments, the leadframe substrate strip 201C is fully plated with a wire-bondable metal and solderable metal layers. For example, the leadframe substrate strip 201C may be a leadframe with a nickel-palladium-gold (Ni—Pd—Au) plating. A high-temperature polyamide tape may be used to secure all package portions in position.

Figure 2D:
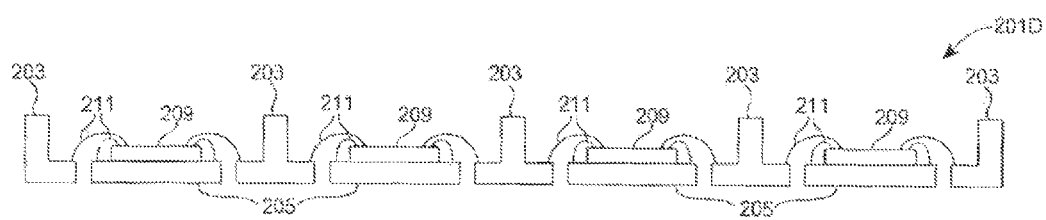

In FIG. 2D, an etched leadframe substrate strip 201D is populated by adhering (e.g., via a standard thermal epoxy or adhesive tape) individual integrated circuit dice 209 to the die attach pads 205. Various adhering techniques and processes are known in the industry. Bonding wires 211 are then attached to electrically connect to portions of the etched leadframe substrate strip 201D.

Figure 2E:

With reference to FIG. 2E, a populated leadframe strip 201E is then encapsulated with an epoxy mold compound 213. Encapsulation techniques are well-known in the art. After encapsulation, exposed portions of the populated leadframe strip 201E are then plated with, for example, tin (Sn), a tin-alloy, Ni/Au or other plating materials possessing characteristics of being electrically-conductive and solderable. The plating allows for good electrical connections when the final package is mounted to a PCB or another die package. If the leadframe substrate strip is pre-plated, this final plating step is unnecessary.

Figure 2F:
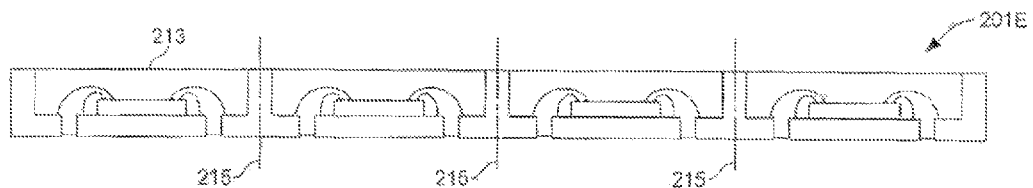

In FIG. 2F, the populated leadframe strip 201E is then singulated by standard techniques such as sawing or laser-cutting along a plurality of saw-lines 215. After the singulation process, a plurality of QFN-type packages are produced. Each of the sidewalls 203, which are a full-height integral part of the formed bond finger features (FIG. 2C) carry an electrical signal from a lower portion of the package to an upper portion of the package. Thus, all electrical signals are available on both upper and lower portions of the final package so three-dimensional stacking of packages is possible.

Alternatively, a skilled artisan can readily envision modifications to the above-described processes wherein DFN-type packages are produced. DFN-type packages have external connection points on two parallel opposing edges of the package rather than on all four edges as with the QFN-type package.

With reference to FIG. 3A, a singulated DFN-type or QFN-type package 300 is shown in cross-section. (Note that either the QFN-type or DFN-type package appears similar to the other in cross-section.) The singulated DFN-type or QFN-type package 300 can be used as a single package and mounted to a PCB or other structure directly. Alternatively, as shown in FIG. 3B, three singulated DFN-type or QFN-type packages 300 are stacked in a three-dimensional structure 350. Each of the singulated packages 300 is electrically connected to the other by, for example, solder joints 301.

FIGS. 4A through 4D indicate alternative embodiments for the substrate strip explained in detail with reference to FIGS. 2A through 2F, supra. A singulation saw 401 (or laser or other singulation method) placement provides an indication of some various arrangements of sidewalls. For comparison purposes, a common sidewall approach of FIG. 4A is the same solid common wall approach described with reference to FIGS. 2A through 2F, supra.

FIG. 4B is an alternate configuration for a sidewall design. A "gap" located between the two singulation saws 401 was formed during the leadframe substrate strip etching process (FIG. 2C). Leaving the gap results in less metal sidewall for the singulation saw 401, thus decreasing sawing time while reducing blade wear.

FIG. 4C indicates a wall arrangement where a gap has been left on the underside of the sidewall. Such an arrangement may be achieved by, for example, two-sided etching. Alternatively, the underside gap may be formed by mechanical means such as punching or stamping.

A dual sidewall arrangement of FIG. 4D is formed similarly to the formation method described with reference to FIG. 4C.

With reference to FIG. 5, various views of completed QFN-type (on the left, 501, 503, 505) and DFN-type (on the right, 551, 553, 555) packages fabricated in accord with exemplary embodiments of the present invention described herein are shown. Top views 501, 551, side views 503, 553, and bottom views 505, 555 are given to visualize completed packages with reference to QFN-type and DFN-type packages respectively. As noted particularly with regard to the bottom views 505, 555, a thermal enhancement of each of the package types is achieve by having a bottom portion of the die attach paddle exposed. The die attach paddle thus arranged provides an efficient conductive thermal path when soldered directly to a PCB. Alternatively, thermal conduction can be achieved through, for example, a thermally-conductive epoxy as well. This thermal enhancement can additionally provide a stable ground by use of down bonds or by electrical connection through a conductive die attach material.

In an alternative three-dimensional stacking arrangement of FIG. 6A, an integrated circuit die 601 is attached directly over a singulated package 300 (FIG. 3A). The integrated circuit die 601 is electrically attached to the singulated package by a plurality of bonding wires 603. An optional encapsulant 605 may be added over the integrated circuit die 601 and the plurality of bonding wires 603. The encapsulating 605 may be applied by molding or dispensing techniques, both of which are known in the art. In a specific exemplary embodiment, the encapsulant 605 may be translucent such that any optical properties of the integrated circuit die 601 may be accessed through the translucent encapsulant 605 (e.g., an LED, optical laser, or EPROM).

In another alternative stacking arrangement of FIG. 6B, an integrated circuit die or discrete component 607 may be pre-mounted on a circuit substrate (e.g., a small daughterboard). Additionally, one or more optional discrete components 611 ma be mounted to the circuitry substrate 609. The integrated circuit die or discrete component 607 and the one or more optional discrete components 611 are electrically connected to the circuitry substrate 609 by a plurality of substrate bonding wires 613 or direct electrical connections (not shown) to the circuitry substrate 609. The circuitry substrate 609, in turn, is electrically connected to the singulated package by a plurality of package bonding wires 615. An optional encapsulant 617 may be added over the integrated circuit die or discrete component 607, the one or more optional discrete components 611, the circuitry substrate 609, and the plurality of bonding wires 613, 615. The encapsulant 617 may be applied by molding or dispensing techniques, both of which are known in the art. In a specific exemplary embodiment, the encapsulant 617 may be translucent such that any optical properties of the integrated circuit die or discrete components 607, 611 may be accessed through the translucent encapsulant 617 (e.g., an LED, optical laser, or EPROM).

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, skilled artisans will appreciate that embodiments of the present invention may be readily applied to modified versions of TAPP® (thin array plastic package), ULGA® (ultra-thin land grid array), BCC® (bumped chip carrier), or other similar package types. The specification and drawings are, accordingly, to be regarded in an illustrative rather than a restrictive sense.

What is claimed is:

1. A method of packaging a semiconductor device, the method comprising:
   mounting an electrical component to an inner portion die pad, the die pad being a portion of a substrate strip component of a first leadless three-dimensional stackable semiconductor package;
   securing a plurality of bond wires from a plurality of bond pads on the electrical component to corresponding ones of a plurality of wirebond pads included on a leadless outer portion of the substrate strip component;
   selecting a sidewall of each of the plurality of wirebond pads, the sidewall having a height to be greater than a combined height of the electrical component and the inner portion die pad; and
   covering the electrical component, bond wires, and any exposed uppermost portions of the die pad with an encapsulating material to the uppermost portion of the sidewalls on the leadless outer portion, wherein an outer side surface of the sidewalls form a substantially continuous outermost edge of the semiconductor package.

2. The method of claim 1, further comprising plating any exposed areas of the uppermost portion of the sidewalls with an electrically conductive and non-oxidizing material.

3. The method of claim 2, wherein the electrically conductive and non-oxidizing material is selected to be tin.

4. The method of claim 2, wherein the electrically conductive and non-oxidizing material is selected to be a tin alloy.

5. The method of claim 2 wherein, the electrically conductive and non-oxidizing material is selected to be a nickel-gold alloy.

6. The method of claim 1, further comprising plating any exposed areas of a lowermost portion of the die pad with an electrically conductive and non-oxidizing material.

7. The method of claim 1, further comprising:
mounting one or more additional electrical components over the encapsulating material; and
securing a plurality of bond wires from the one or more additional electrical components to the uppermost portion of the sidewalls.

8. The method of claim 7, wherein the one or more additional electrical components are first mounted to a circuitry substrate prior to being mounted over the encapsulating material.

9. The method of claim 1, further comprising mounting an additional leadless three-dimensional package in electrical contact over the first leadless three-dimensional stackable semiconductor package.

10. The method of claim 1, wherein covering the electrical component, bond wires, and any exposed uppermost portions of the die pad with the encapsulating material includes forming the encapsulating material substantially over both the leadless outer portion and the inner portion die pad and leaving an uppermost portion of the sidewall, a lowermost portion of the sidewall, and an outer side surface of the sidewall exposed, wherein the sidewall is substantially perpendicular to the wirebond pads, and the wirebond pads are integrally formed with the sidewall, the outer side surface of the sidewall being disposed at and forming a substantially continuous outermost edge of the semiconductor package.

11. A method of fabricating a leadless package for a semiconductor device, the method comprising:
selecting a substrate with a given height;
choosing the height of the substrate to be greater than a die pad and an integrated circuit die combined;
patterning and etching the substrate to produce an area of the substrate to have a reduced thickness,
selecting a portion of the reduced thickness area to serve as the die pad;
patterning and etching the die pad to be electrically isolated from an outer portion of the substrate on at least two edge regions;
patterning and etching the at least two outer edge regions of the substrate to serve as a plurality of bonding pads and sidewalls;
electrically isolating each of the plurality of bonding pads and sidewalls from each other to form leadless three-dimensional connection areas; and
forming the sidewalls to be essentially perpendicular to the bonding pads while maintaining the sidewalls at substantially the selected height of the substrate and having an outer side surface of the sidewalls forming a substantially continuous outermost edge of the leadless package.

12. The method of claim 11, further comprising:
mounting the integrated circuit die to the die pad;
securing a plurality of bond wires from a plurality of bond pads on the electrical component to corresponding ones of the plurality of bonding pads; and
covering the integrated circuit die, bond wires, and any exposed portions of the die pad with an encapsulating material to an uppermost portion of the sidewalls on the leadless three-dimensional connection areas.

13. The method of claim 12, wherein covering the integrated circuit die, bond wires, and any exposed portions of the die pad with the encapsulating material includes forming the encapsulating material substantially over both the leadless three-dimensional connection areas and the die pad and leaving an uppermost portion of the sidewalls, a lowermost portion of the sidewalls, and an outer side surface of the sidewalls exposed, wherein the outer side surface is disposed at and forms a substantially continuous outermost edge of the leadless package.

14. The method of claim 11, wherein forming the sidewalls includes forming the sidewalls including an outer side surface disposed at and forming a substantially continuous outermost edge of the leadless package.

15. The method of claim 11, wherein patterning and etching the die pad includes forming the die pad to include a thickness that is less than a height of the sidewalls, the die pad configured to serve as an attachment area for an integrated circuit die, wherein the thickness of the die pad is sized to accommodate an attached integrated circuit die, such that a top surface of the attached integrated circuit die is disposed below a top of the sidewalls.

16. A method comprising:
mounting an electrical component to an inner portion of a substrate strip component of a leadless three-dimensional stackable semiconductor package;
securing a plurality of bond wires from a plurality of bond pads on the electrical component to corresponding wire bonding areas included on a leadless outer portion of the substrate strip component; and
selecting a height of a sidewall of each wire bonding area to be greater than a combined height of the electrical component and the inner portion, wherein each sidewall is integrally formed with and substantially perpendicular to the corresponding flat wire bonding area, an outer side surface of the sidewalls being disposed at and forming a substantially continuous outermost edge of the semiconductor package, the inner portion being located within and electrically isolated from the outer portion, the inner portion having a thickness that is less than a height of the sidewalls of the outer portion and being configured to serve as an attachment area for the electrical component, the thickness of the inner portion configured such that a top surface of an attached electrical component is disposed below a top of the sidewalls.

17. The method of claim 16, comprising covering the electrical component, bond wires, and exposed uppermost portions of the die pad with an encapsulating material to the uppermost portion of the sidewalls on the leadless outer portion.

18. The method of claim 17, wherein covering the electrical component, bond wires, and exposed portions of the die pad with the encapsulating material includes forming the encapsulating material substantially over both the inner portion and the outer portion and leaving an uppermost uppermost portions of the sidewalls, a lowermost portion of the sidewalls, and the outer side surface of the sidewalls exposed.

19. The method of claim 16, comprising plating exposed areas of the uppermost portion of the sidewalls with an electrically conductive and non-oxidizing material.

20. The method of claim 16, comprising plating exposed areas of a lowermost portion of the inner portion with an electrically conductive and non-oxidizing material.

* * * * *

UNITED STATES PATENT AND TRADEMARK OFFICE
CERTIFICATE OF CORRECTION

| | |
|---|---|
| PATENT NO. | : 8,278,150 B2 |
| APPLICATION NO. | : 12/891386 |
| DATED | : October 2, 2012 |
| INVENTOR(S) | : Ken M. Lam |

It is certified that error appears in the above-identified patent and that said Letters Patent is hereby corrected as shown below:

Column 1, Line 24, delete "mufti-functional" and insert -- multi-functional --, therefor.

Column 1, Line 66, delete "packages" and insert -- package --, therefor.

Column 2, Line 55, delete "bottom" and insert -- bottom, --, therefor.

Column 2, Line 63, delete "form" and insert -- from --, therefor.

Column 3, Line 23, delete "combine" and insert -- combined --, therefor.

Column 3, Line 40, delete "simulation." and insert -- singulation. --, therefor.

Column 5, Line 49, delete "achieve" and insert -- achieved --, therefor.

Column 5, Line 63, delete "encapsulating" and insert -- encapsulant --, therefor.

Column 6, Line 7, delete "ma be" and insert -- may be --, therefor.

Column 8, Line 52, in Claim 18, delete "portions" and insert -- uppermost portions --, therefor.

Column 8, Line 56, in Claim 18, delete "portions" and insert -- portion --, therefor.

Signed and Sealed this
Twenty-second Day of January, 2013

David J. Kappos
*Director of the United States Patent and Trademark Office*